United States Patent [19]
Sakoh et al.

[11] Patent Number: 5,858,837
[45] Date of Patent: Jan. 12, 1999

[54] METHOD OF MANUFACTURING SEMICONDUCTOR MEMORY DEVICE

[75] Inventors: Takashi Sakoh; Ichiro Honma, both of Tokyo, Japan

[73] Assignee: NEC Corporation, Tokyo, Japan

[21] Appl. No.: 966,871

[22] Filed: Nov. 10, 1997

[30] Foreign Application Priority Data

Nov. 12, 1996 [JP] Japan ..................................... 8-300102

[51] Int. Cl.$^6$ ............................................... H01L 21/8242
[52] U.S. Cl. ........................................... 438/255; 438/398
[58] Field of Search .................................... 438/238, 239, 438/253–256, 381, 396–399

[56] References Cited

U.S. PATENT DOCUMENTS

| | | | |
|---|---|---|---|
| 5,447,878 | 9/1995 | Park et al. | 437/52 |
| 5,554,557 | 9/1996 | Koh | 437/52 |
| 5,792,689 | 8/1998 | Yang et al. | 438/253 |

FOREIGN PATENT DOCUMENTS

| | | |
|---|---|---|
| 3-272165 | 12/1991 | Japan . |
| 5-67730 | 3/1993 | Japan . |

Primary Examiner—Joni Y. Chang
Attorney, Agent, or Firm—Sughrue, Mion, Zinn, Macpeak & Seas, PLLC

[57] ABSTRACT

A method of manufacturing a semiconductor memory device, comprising the steps of: forming a gate electrode with an insulating spacer, forming a first silicon oxide film by high-temperature chemical vapor deposition (CVD), forming n-type source/drain regions, forming a first insulating interlayer and forming a bit line; forming a second silicon oxide film by low-temperature CVD, forming a BPSG film, and annealing the second silicon oxide film and the BPSG film by first annealing to form a second insulating interlayer constituted by the stacked films; forming a third silicon oxide film by low-temperature CVD, and annealing the third silicon oxide film by second annealing; forming a node contact hole through the annealed third silicon oxide film, the second insulating interlayer, the first insulating interlayer, and the first silicon oxide film; forming an amorphous silicon film doped n-type at the time of the film formation, patterning the amorphous silicon film to form an amorphous silicon film pattern, and removing a native oxide film on a surface of the amorphous silicon film pattern using dilute hydrofluoric acid; and converting the amorphous silicon film pattern into an n-type hemispherical grained (HSG) polysilicon film pattern by third annealing to form a storage node electrode, forming a capacitive dielectric film, and forming a cell plate electrode.

12 Claims, 9 Drawing Sheets

METHOD OF MANUFACTURING SEMICONDUCTOR MEMORY DEVICE

BACKGROUND OF THE INVENTION

1. Field of the Invention

The present invention relates to a method of manufacturing a semiconductor memory device and, more particularly, to a method of manufacturing a DRAM having a stacked capacior of a hemispherical grained (HSG) type (predetermined annealing is applied on an amorphous silicon film pattern to convert it into a polysilicon film pattern and the surface of the polysilicon film pattern into a hemispherical gained (HSG) surface to form a storage node electrode).

2. Description of the Prior Art

In recent years, semiconductor memory devices continue to shrink in feature size and increase in integration density. Particularly, the integration density of DRAMs has quadrupled every three years, i.e., 64 Mbits, 256 Mbits, and 1 Gbit. Along with this tendency of higher integration, the cell size of memory cells is also reduced. For a 64-Mbit cell, the cell size is about 1.0 $\mu m^2$, and for a 256-Mbit cell, the cell size is about 0.55 $\mu m^2$. Such cell size reduction makes it difficult to ensure a prescribed cell capacitance. For this reason, the main stream is a stacked capacitor having a three-dimensional storage node electrode. For the three-dimensional storage node electrode, the bit line is arranged under the capacitor (COB structure). In a memory cell having such a COB structure, a BPSG film is often used as an insulating interlayer between the bit line and the capacitor.

The present inventor has filed Japanese Unexamined Patent Publication No. 3-272165 which discloses a technique of converting the exposed two-dimensional upper and side surfaces of the storage node electrode into surfaces with microstructures to increase the cell capacitance. The storage node electrode of the stacked capacitor according to this prior art is formed in the following manner. The surface of an amorphous silicon film pattern is processed at a temperature slightly higher than the phase transition temperature from amorphous silicon to polysilicon, whereby the amorphous silicon film pattern is converted into a polysilicon film pattern. Simultaneously, the surface of the polysilicon film pattern is covered with hemispherical grains (HSG) to form a storage node electrode.

In formation of a DRAM memory cell having an HSG stacked capacitor, it is essential to remove the native oxide film on the surface of the amorphous silicon film pattern before the HSG process at the above temperature. The native oxide film is removed using dilute hydrofluoric acid, as disclosed in Japanese Unexamined Patent Publication No. 5-67730 filed by the present inventor.

The memory cell having the COB structure in which the storage node electrode is formed on an insulating interlayer consisting of a BPSG film has the following disadvantages.

When the amorphous silicon film pattern as a prospective storage node electrode is directly formed on the BPSG film, those portions of the BPSG film which are not covered with the amorphous silicon film pattern are also etched in the dilute hydrofluoric acid process of removing the native oxide film on the amorphous silicon film pattern. The BPSG film forms an undercut at the bottom portion of the amorphous silicon film pattern, and the mechanical strength of the amorphous silicon film pattern or the HSG-converted polysilicon film pattern (i.e., the storage node electrode) suffers.

For this reason, these film patterns may easily break, resulting in poor workability in subsequent manufacturing processes. Even when the surface of the BPSG film is covered with a silicon oxide film (LTO film) formed by low-temperature chemical vapor deposition such as APCVD, such a degradation in mechanical strength can hardly be suppressed (although the degree of undercut is relaxed to some extent).

The degradation in mechanical strength can be easily suppressed if the surface of the BPSG film is covered with a silicon nitride film (which is sufficiently thicker than a capacitive dielectric film) or a silicon oxide film (HTO film) formed by high-temperature chemical vapor deposition. In these cases, however, the threshold value ($V_{TH}$) of the n-channel MOS transistor (transfer transistor) constituting the memory cell varies to a small value to result in hold failures. The reason why this phenomenon takes place when the surface of the BPSG film is covered with a silicon nitride film is as follows. In the hydrogen alloy process as a postprocess, hydrogen cannot easily reach the interface between the gate oxide film and the p-type silicon substrate of the n-channel MOS transistor because of the presence of the sufficiently thick silicon nitride film, and interfacial charges trapped at the interfacial level of the interface can hardly be decreased. When the surface of the BPSG film is to be covered with an HTO film, the n-channel MOS transistor is held at a temperature of about 800° C. for a long time during formation of the HTO film. As a result, a short channel effect becomes prominent by redistribution of the impurity in n-type source and drain regions, thus making the threshold value $V_{TH}$ smaller than the design target value. The HTO film is formed by high-temperature chemical vapor deposition at about 800° C., i.e., low-pressure chemical vapor deposition (LPCVD) using monosilane ($SiH_4$) and nitrous oxide ($N_2O$). Although the actual HTO film deposition time itself is relatively short, the entire process takes a time of about three hours including the time for inserting/extracting the structure into/from the film forming apparatus.

SUMMARY OF THE INVENTION

The present invention has been made in consideration of the above situation, and has as its object to provide a method of manufacturing a semiconductor memory device, in which in formation of a DRAM having an HSG stacked capacitor with a COB structure, the workability is prevented from being degraded (the threshold value $V_{TH}$ of the transfer transistor is prevented from varying to a small value) while maintaining a prescribed mechanical strength of the storage node electrode, thereby decreasing hold failures.

In order to achieve the above object, according to the first aspect of the present invention, there is provided a method of manufacturing a semiconductor memory device, comprising the steps of forming a gate electrode with underlaying gate oxide film on a surface of a p-type silicon substrate, forming an insulating film spacer covering a side wall of the gate electrode, forming a first silicon oxide film on an entire surface by high-temperature chemical vapor deposition, ion-implanting an n-type impurity into the surface of the p-type silicon substrate to form n-type source/drain regions, forming a first insulating interlayer on the entire surface, forming a bit contact hole reaching one of the n-type source/drain regions through the first insulating interlayer and the first silicon oxide film, and forming a bit line, forming a second silicon oxide film on the entire surface by low-temperature chemical vapor deposition, forming a BPSG film on the entire surface, and annealing the second silicon oxide film and the BPSG film by first annealing to form a second insulating interlayer constituted by the stacked films, forming a third silicon oxide film on the entire surface by low-temperature chemical vapor deposition, and annealing the third silicon oxide film by second annealing, forming a node contact hole reaching the other of the n-type source/drain regions through the annealed third silicon oxide film, the second insulating interlayer, the first insulating interlayer, and the first silicon oxide film, forming an amorphous silicon film doped n-type at the time of film formation on the entire surface, patterning the amorphous silicon film to form an amorphous silicon film pattern, and removing a native oxide film on a surface of the amorphous silicon film pattern using dilute hydrofluoric acid, and converting the amorphous silicon film pattern into an n-type hemispherical grained (HSG) polysilicon film pattern by third annealing to form a storage node electrode, forming a capacitive dielectric film, and forming a cell plate electrode. Preferably, the low-temperature chemical vapor deposition is APCVD or PECVD, the second annealing is RTA at 750° C. to 950° C. or furnace annealing at 750° C. to 800° C., and the method further comprises, after the step of forming the node contact hole, forming a contact plug filling the node contact hole. More preferably, the method further comprises, after the step of forming the node contact hole, forming an undoped polysilicon film having a thickness smaller than ½ of a size of the node contact hole on the entire surface, ion-implanting an n-type impurity to convert the polysilicon film into a first n-type polysilicon film, forming a second n-type polysilicon film D on the entire surface, and etching back the second and first n-type polysilicon films.

According to the second aspect of the present invention, there is provided a method of manufacturing a semiconductor memory device, comprising the steps of forming a gate electrode with underlaying gate oxide film on a surface of a p-type silicon substrate, forming an insulating film spacer covering a side wall of the gate electrode, forming a first silicon oxide film on an entire surface by high-temperature chemical vapor deposition, ion-implanting an n-type impurity into the surface of the p-type silicon substrate to form n-type source/drain regions, forming a first insulating interlayer on the entire surface, forming a bit contact hole reaching one of the n-type source/drain regions through the first insulating interlayer and the first silicon oxide film, and forming a bit line, forming a second silicon oxide film on the entire surface by low-temperature chemical vapor deposition, forming a BPSG film on the entire surface, and annealing the second silicon oxide film and the BPSG film by first annealing to form a second insulating interlayer constituted by the stacked films, forming a third silicon oxide film on the entire surface by low-temperature chemical vapor deposition, and annealing the third silicon oxide film by second annealing, forming a node contact hole reaching the other of the n-type source/drain regions through the annealed third silicon oxide film, the second insulating interlayer, the first insulating interlayer, and the first silicon oxide film, forming an undoped polysilicon film having a thickness smaller than ½ of a size of the node contact hole on the entire surface, ion-implanting an n-type impurity to convert the polysilicon film into a first n-type polysilicon film, forming a second n-type polysilicon film on the entire surface, forming an amorphous silicon film doped n-type at the time of film formation on the entire surface, patterning the amorphous silicon film and the second and first n-type polysilicon films to form an amorphous silicon film pattern and second and first n-type polysilicon film patterns, and removing native oxide films on surfaces of the second and first n-type polysilicon film patterns and a surface of the amorphous silicon film pattern using dilute hydrofluoric acid, and converting the amorphous silicon film pattern into a third n-type HSG polysilicon film pattern by third annealing to form a storage node electrode constituted by the first, second, and third n-type polysilicon film patterns, forming a capacitive dielectric film, and forming a cell plate electrode.

According to the third aspect of the present invention, there is provided a method of manufacturing a semiconductor memory device, comprising the steps of forming a gate electrode with underlaying gate oxide film on a surface of a p-type silicon substrate via a gate oxide film, forming an insulating film spacer covering a side wall of the gate electrode, forming a first silicon oxide film on an entire surface by high-temperature chemical vapor deposition, ion-implanting an n-type impurity into the surface of the p-type silicon substrate to form n-type source/drain regions, forming a first insulating interlayer on the entire surface, forming a bit contact hole reaching one of the n-type source/drain regions through the first insulating interlayer and the first silicon oxide film, and forming a bit line, forming a second silicon oxide film on the entire surface by low-temperature chemical vapor deposition, forming a BPSG film on the entire surface, and annealing the first silicon oxide film and the BPSG film by first annealing to form a second insulating interlayer constituted by the stacked films, forming a third silicon oxide film on the entire surface by low-temperature chemical vapor deposition, and annealing the third silicon oxide film by second annealing, forming a node contact hole reaching the other of the n-type source/drain regions through the annealed third silicon oxide film, the second insulating interlayer, the first insulating interlayer, and the first silicon oxide film, sequentially forming a first amorphous silicon film doped n-type at the time of film formation and a PSG film on the entire surface, sequentially patterning the PSG film and the first amorphous silicon film to form a PSG film pattern and a first amorphous silicon film pattern, forming a second amorphous silicon film doped n-type at the time of film formation on the entire surface, and etching back the second amorphous silicon film to form a second amorphous silicon film pattern covering side surfaces of the PSG film pattern and the first amorphous silicon film pattern, removing the PSG film pattern and native oxide films on surfaces of the first and second amorphous silicon film patterns using dilute hydrofluoric acid, and converting the first and second amorphous silicon film patterns into a first and second n-type HSG polysilicon film patterns by third annealing, respectively, to form a storage node electrode, forming a capacitive dielectric film, and forming a cell plate electrode. Preferably, the low-temperature chemical vapor deposition is APCVD or PECVD, the second annealing is RTA at 750° C. to 950° C. or furnace annealing at 750° C. to 800° C., and the method further comprises, after the step of forming the node contact hole, forming a contact plug filling the node contact hole.

According to the fourth aspect of the present invention, the low-temperature chemical vapor deposition in the first to third aspects is atmospheric pressure chemical vapor deposition (APCVD) or plasma enhanced chemical vapor deposition (PECVD).

According to the fifth aspect of the present invention, the second annealing in the first to fourth aspects is rapid thermal annealing (RTA) at 750° C. to 950° C. or furnace annealing at 750° C. to 800° C.

According to the sixth aspect of the present invention, the method further comprises, after the step of forming the node contact hole in the first to third aspects, forming a contact plug filling the node contact hole.

According to the seventh aspect of the present invention, the method further comprises, after the step of forming the node contact hole in the sixth aspect, forming an undoped polysilicon film having a thickness smaller than ½ of a size of the node contact hole on the entire surface, ion-implanting the n-type impurity to convert the polysilicon film into a first n-type polysilicon film, forming a second n-type polysilicon film on the entire surface, and etching back the second and first n-type polysilicon films.

As is apparent from the above aspects, according to the method of manufacturing a semiconductor memory device of the present invention, in formation of a DRAM having an HSG stacked capacitor with a COB structure, the bit line is covered with the first LTO film and the BPSG film. These stacked films are annealed by the first annealing at about 700° C. to form the second insulating interlayer. The second LTO film covering the second insulating interlayer is formed and annealed by the second annealing, i.e., RTA at 750° C. to 950° C. or furnace annealing at 750° C. to 800° C. With this process, the workability can be prevented from deteriorating (the threshold value $V_{TH}$ of the transfer transistor can be prevented from varying to a small value) while maintaining a prescribed mechanical strength of the storage node electrode, so that hold failures can be easily decreased.

The above and many other objects, features and advantages of the present invention will become manifest to those skilled in the art upon making reference to the following detailed description and accompanying drawings in which preferred embodiments incorporating the principles of the present invention are shown by way of illustrative example.

DETAILED DESCRIPTION OF THE PREFERRED EMBODIMENTS

Prior to a description of preferred embodiments of the present invention, details of a technical survey that led to the present invention, and the arrangement of the present invention will be described. More specifically, in association with removal of the native oxide film on the surface of an amorphous silicon film pattern using dilute hydrofluoric acid, various experimental measurements were made to select preferable conditions (and restriction conditions) for the upper surface of an insulating interlayer directly contacting the amorphous silicon film pattern from the viewpoint of workability. Subsequently, the conditions for preventing a degradation in hold characteristics of the DRAM memory cell were explicated from these conditions.

The storage node electrode of a stacked capacitor of HSG type is formed in the following manner. An n-type amorphous silicon film which is heavily doped at the time of formation of the film on the surface of an insulating film (in-situ) is patterned. After the native oxide film on the surface of the amorphous silicon film pattern is removed, predetermined annealing is performed so as to convert the amorphous silicon film pattern into a polysilicon film pattern and simultaneously convert the surface of the amorphous silicon film pattern into a hemispherical grained (HSG) surface. This annealing is performed at a temperature of, e.g., about 590° C., i.e., slightly higher than the phase transition temperature from amorphous silicon to polysilicon. The polysilicon film is exposed to disilane ($Si_2H_6$) at this temperature and a pressure of 133 Pa for about two minutes to convert the surface into the HSG surface. Since amorphous silicon cannot completely be converted into polysilicon at 590° C. in two minutes, the amorphous silicon film is continuously held in the nonoxidation atmosphere at 590° C. for about 10 minutes to prompt conversion into polysilicon.

Figure 1:
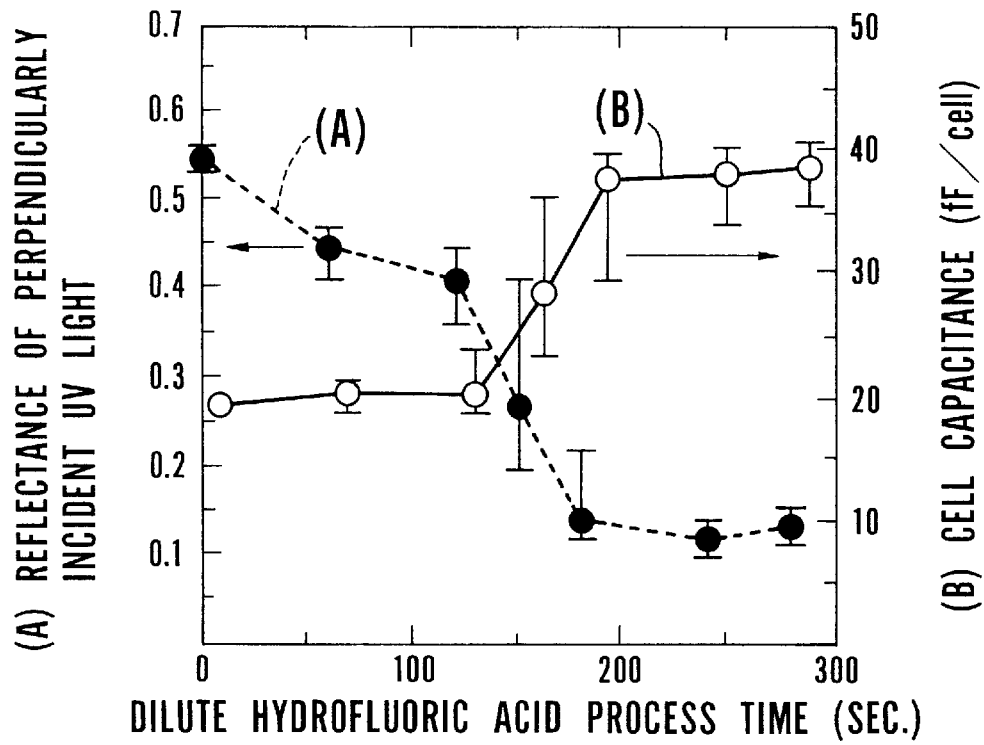
FIG. 1 is a graph showing a change (A) in reflectance of UV light on the upper surface of an amorphous silicon film pattern and a change (B) in cell capacitance as a function of the dilute hydrofluoric acid process time so as to explain the effect of the present invention.

When the exposed surface area of the storage node electrode is, e.g., 2.46 μm, the thickness of the capacitive dielectric film is, e.g., 5 nm as a silicon oxide film thickness, and no HSG process is performed, the cell capacitance is 20 fF/cell. If a sufficiently long HSG process is performed for the amorphous silicon film pattern, the exposed surface area of the storage node electrode effectively increases to about twice, so that the cell capacitance is 40 fF/cell. Whether the HSG process is sufficiently long or not depends on removal of the native oxide film. Removal of the native oxide film on the surface of the amorphous silicon film pattern using dilute hydrofluoric acid having a composition of $HF:H_2O=1:100$ will be described with reference to FIG. 1. As indicated by a line (A) in FIG. 1, the reflectance of UV light which is perpendicularly incident on the upper surface of the amorphous silicon film pattern lowers as the dilute hydrofluoric acid process time becomes long. When three to four minutes have elapsed, the reflectance converges to about 0.1. That is, the native oxide film on the (exposed) surface of the amorphous silicon film pattern is almost completely removed when the UV light reflectance converges. This is consistent with the fact that the cell capacitance value increases and converges as the dilute hydrofluoric acid process time becomes long, as indicated by a line (B) in FIG. 1. As is apparent from this result, the time of the dilute hydrofluoric acid process using dilute hydrofluoric acid having a composition of 1:100 is preferably at least four minutes.

The etch rate of etching using dilute hydrofluoric acid having the above composition for the annealed BPSG film is 35 to 40 nm/min. When the amorphous silicon film pattern is directly formed on the surface of the BPSG film, a recessed portion having a depth of about 0.15 μm is formed on the surface of the BPSG film between two adjacent amorphous silicon film patterns by the approximately 4-minute dilute hydrofluoric acid process, and an undercut forms in the BPSG film contacting the bottom surface of these amorphous silicon film patterns. Assume a 0.25-μm design rule. In this case, since the short side of the upper surface of the amorphous silicon film pattern (storage node electrode) is about 0.3 to 0.35 μm, almost the entire bottom surface of the amorphous silicon film pattern (storage node electrode) is exposed due to undercut of the BPSG film by the dilute hydrofluoric acid process (as described in the object of the present invention), resulting in a disadvantage from the viewpoint of workability. When the 0.25-μm design rule is assumed, the recessed portion formed by the dilute hydrofluoric acid process is preferably as deep as about 60 nm from the viewpoint of workability. Therefore, the etch rate of etching using dilute hydrofluoric acid having the above composition is preferably as low as 15 nm/min.

For an HTO film formed by high-temperature chemical vapor deposition (i.e., LPCVD) at 800° C. using monosilane and nitrous oxide as source gases, the etch rate of etching using dilute hydrofluoric acid having the above composition is up to 10 nm/min. When the surface of the insulating interlayer consisting of a BPSG film is covered with the HTO film, no problem is posed from the viewpoint of workability. For an LTO film (at the time of film formation) formed by APCVD at 350° C. to 400° C. using monosilane and oxygen ($O_2$) as source gases, or an LTO film (at the time of film formation) formed by APCVD at 350° C. to 400° C. using TEOS (tetraethoxysilane; $Si(OC_2H_5)_4$) and ozone ($O_3$) as source gases, the etch rate of etching using dilute hydrofluoric acid having the above composition is 30 nm/min. When the surface of the insulating interlayer consisting of a BPSG film is simply covered with the LTO film at the time of film formation, the etching stopper function for the dilute hydrofluoric acid process cannot be expected.

Figure 2:
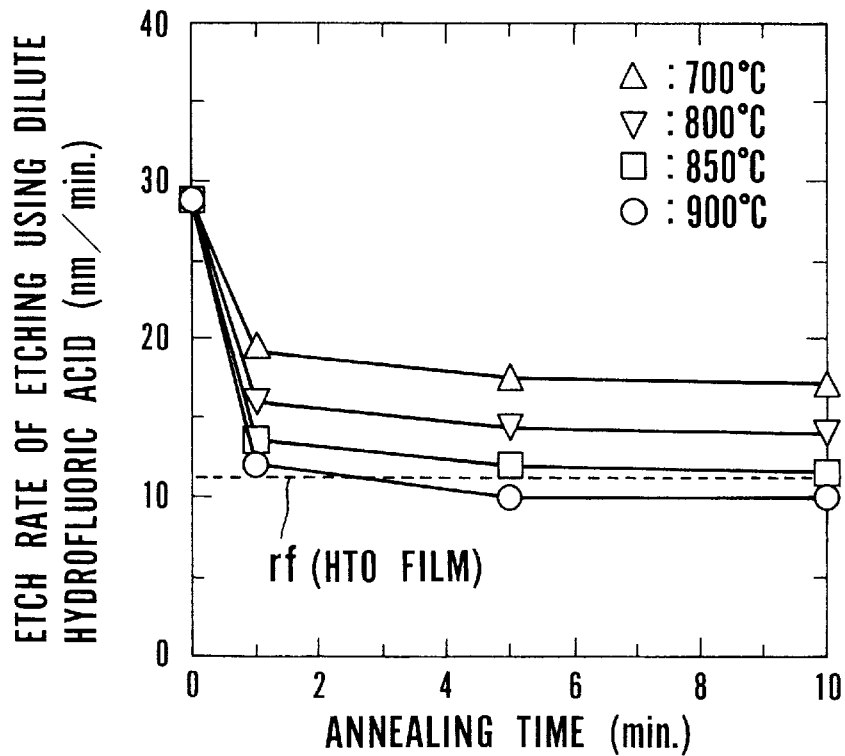
FIG. 2 is a graph showing a change in etch rate of etching using dilute hydrofluoric acid as a function of the annealing time for an LTO film so as to explain the effect of the present invention.

The present inventors attempted to improve the etching stopper function by annealing such a structure in which an LTO film is formed by APCVD on the surface of the insulating interlayer consisting of a BPSG film. FIG. 2 shows part of the examination result. Annealing temperatures of 700° C., 800° C., 850° C., and 900° C. are set as parameters. The etch rate of etching using dilute hydrofluoric acid having the above composition sharply lowers during annealing (RTA) of about one minute, and thereafter, gradually lowers as the process time increases, as shown in FIG. 2. The present inventors concluded from the result shown in FIG. 2 that annealing is preferably performed at 750° C. or more. The same result as described above was obtained for an LTO film formed by PECVD. It is undesirable to employ a silicon oxide film formed by LPCVD using only TEOS or TEOS containing a very small amount of oxygen in place of the LTO film formed by APCVD or PECVD. When such a silicon oxide film is annealed under the above conditions, the degree of decrease in etch rate with respect to the annealing time is much slower than that for the LTO film.

Changes in threshold value VTH of the n-channel MOS transistor (transfer transistor) constituting the memory cell, which were observed when the LTO film was annealed under the above conditions, were measured to calculate an appropriate process time at each annealing temperature. The structure of the DRAM memory cell used for the measurement will be described below.

The transfer transistor is formed on the surface of a p-type silicon substrate having a surface impurity concentration of about $2 \times 10^{17}$ $cm^{-3}$. A designed gate length L and a designed gate width W of the transfer transistor are 0.25 μm and 0.3 μm, respectively. The thickness of a gate oxide film is 8 nm. Gate electrodes with underlaying gate oxide films are formed from a tungsten polycide film in which a tungsten silicide film having a thickness of about 100 nm is stacked on a heavily doped n-type polysilicon film having a thickness of about 100 nm. The gate electrode interval is 0.35 μm. The side wall of each gate electrode is covered with an insulating film spacer consisting of a silicon oxide film or a silicon nitride film having a thickness of about 100 nm. The surface of the transfer transistor, including n-type source and drain regions, is covered with an HTO film (first silicon oxide film) having a thickness of approximately 20 nm. The HTO film is covered with a first insulating interlayer consisting of a first BPSG film having a thickness of about 800 nm. A bit contact hole reaching one of the n-type source and drain regions is formed in the first insulating interlayer. The bit contact hole is filled with a contact plug. A bit line consisting of a tungsten polycide film in which a tungsten silicide film having a thickness of roughly 100 nm is stacked on a heavily doped n-type polysilicon film having a thickness of about 100 nm is formed on the surface of the first insulating interlayer.

The n-type source and drain regions are formed by, e.g., ion implantation after formation of the HTO film. The first BPSG film is formed by APCVD at 350° C. to 400° C. using TEOS, TMP (trimethyl phosphate; $PO(OCH_3)_3$), TMB (trimethyl borate; $B(OCH_3)_3$), and ozone as source gases (after film formation, this BPSG film is annealed at 700° C. for 20 minutes).

The surface of the first insulating interlayer including the bit line is covered with a second silicon oxide film having a thickness of about 100 nm. The second silicon oxide film is covered with a second BPSG film having a thickness of about 800 nm. A second insulating interlayer is formed from the second silicon oxide film and the second BPSG film. The second insulating interlayer is covered with a third silicon oxide film having a thickness of about 100 nm. A node contact hole reaching the other of the n-type source and drain regions through the third silicon oxide film and the second and first insulating interlayers is formed. A storage node electrode of HSG type is formed and connected to the n-type source/drain region through the node contact hole. The storage node electrode is covered with a capacitive dielectric film having a thickness of nearly 5 nm as a silicon oxide film thickness. The capacitive dielectric film is covered with a cell plate electrode. The cell plate electrode is covered with a third insulating interlayer.

The second silicon oxide film is an LTO film at the time of film formation. After the second BPSG film is formed, the first annealing is performed at 800° C. for 30 minutes. The second silicon oxide film and the second BPSG film are annealed by this first annealing, so that the second insulating interlayer is formed from these stacked films. The third silicon oxide film is also an LTO film at the time of film formation. The third silicon oxide film is annealed by the second annealing. To form the storage node electrode, the third annealing for the HSG process must be performed at 590° C. for a time a bit longer than 10 minutes. To form the capacitive dielectric film, annealing must be performed at 800° C. for about 30 minutes. To form the third insulating interlayer, annealing at 700° C. for about 20 minutes is required. That is, the memory cell subjected to measurement is annealed at 800° C. for at least one hour even if annealing at 700° C. and 590° C. is neglected (excluding the conditions for the second annealing).

Figure 3A:
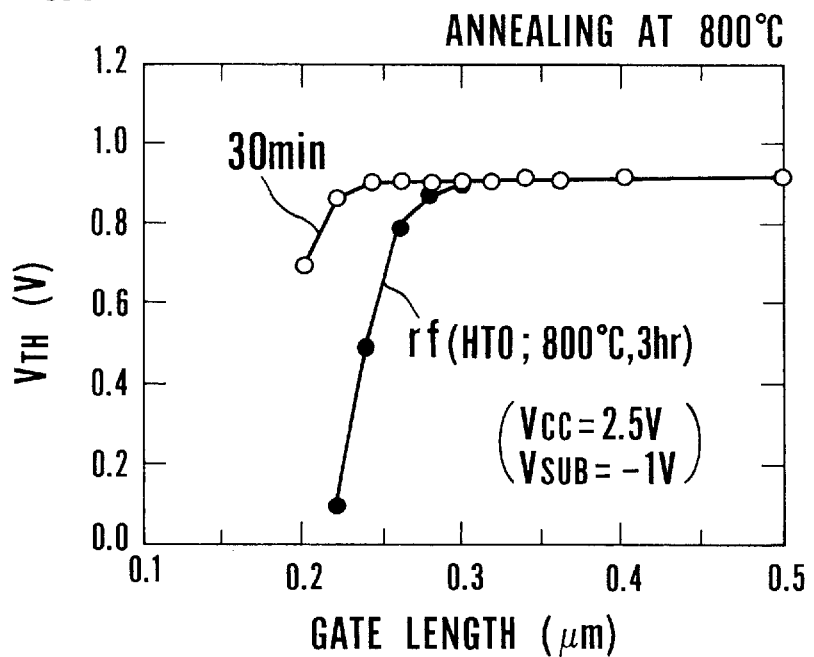
FIGS. 3A to 3C are graphs showing the dependency of the threshold value VTH on the gate length under various process conditions so as to explain the effect of the present invention.
Figure 3B:
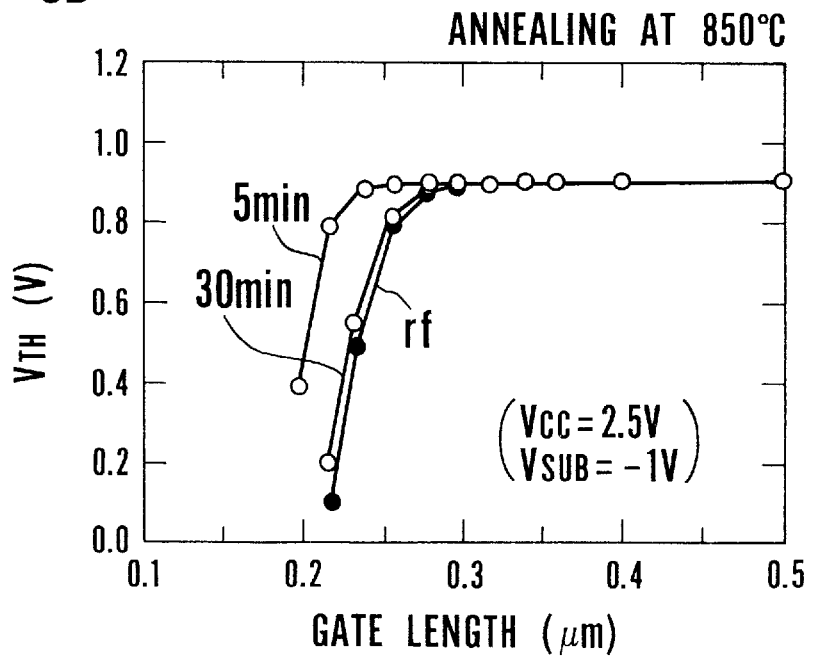
Figure 3C:
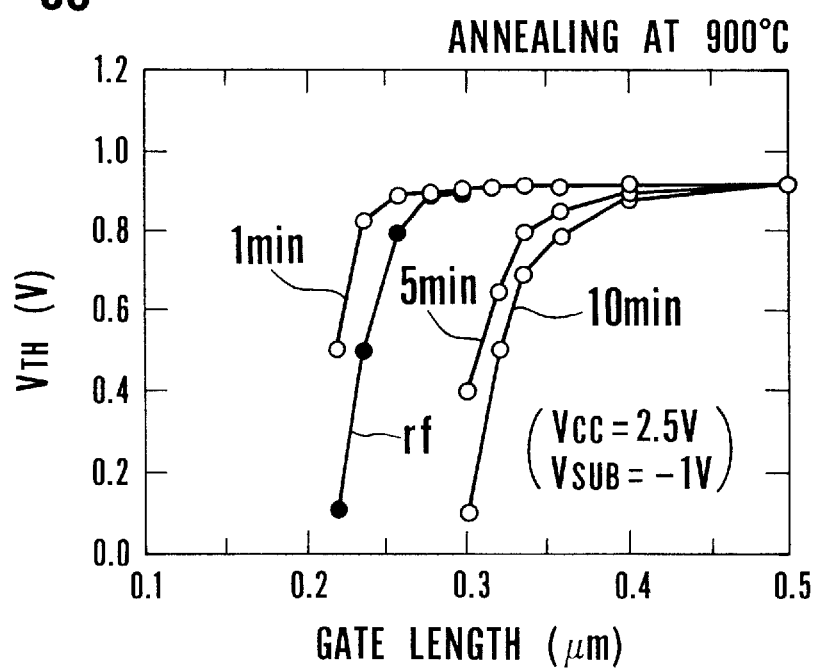
Figure 4A:
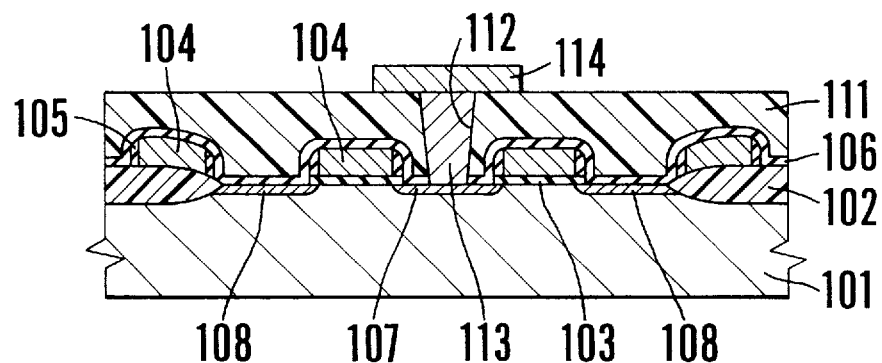
FIGS. 4A to 4E are schematic sectional views showing steps in manufacturing a semiconductor memory device according to the first embodiment of the present invention.
Figure 4B:
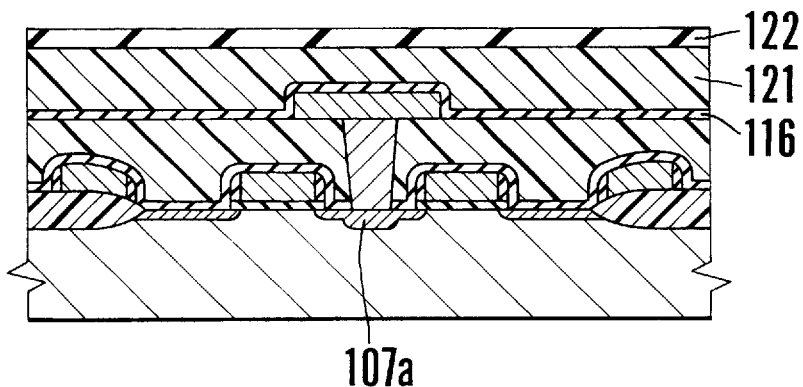
Figure 4C:
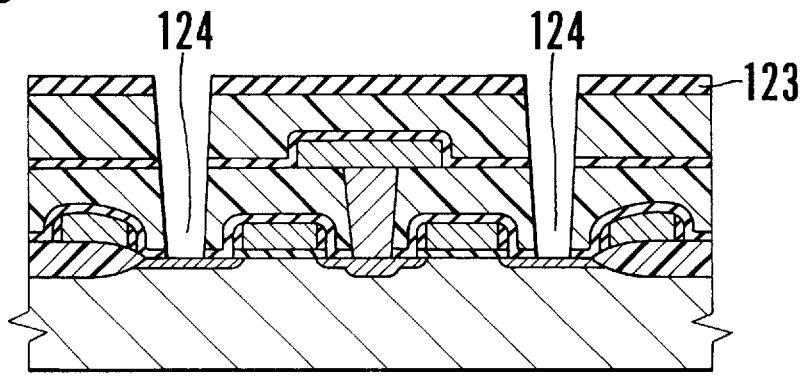
Figure 4D:
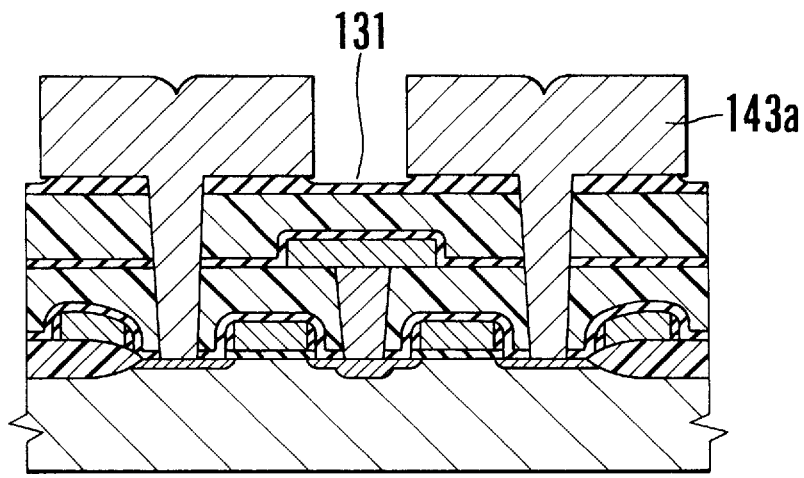
Figure 4E:
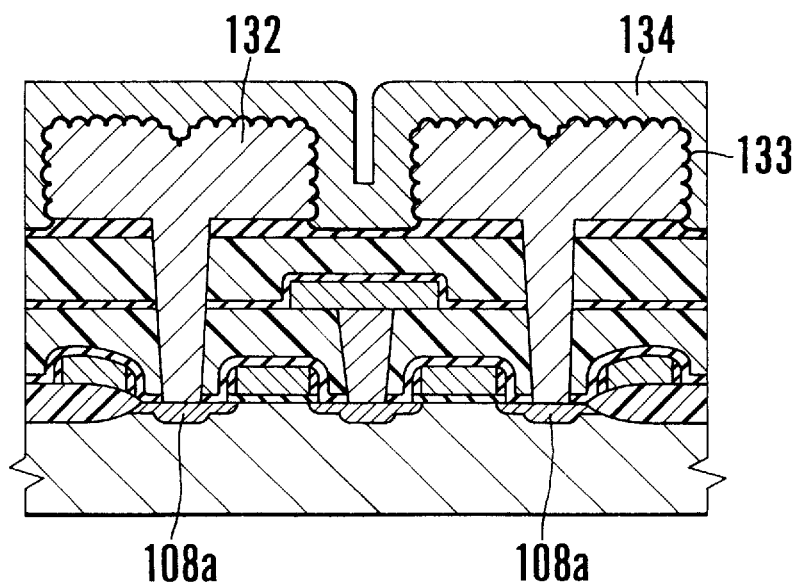
Figure 5A:
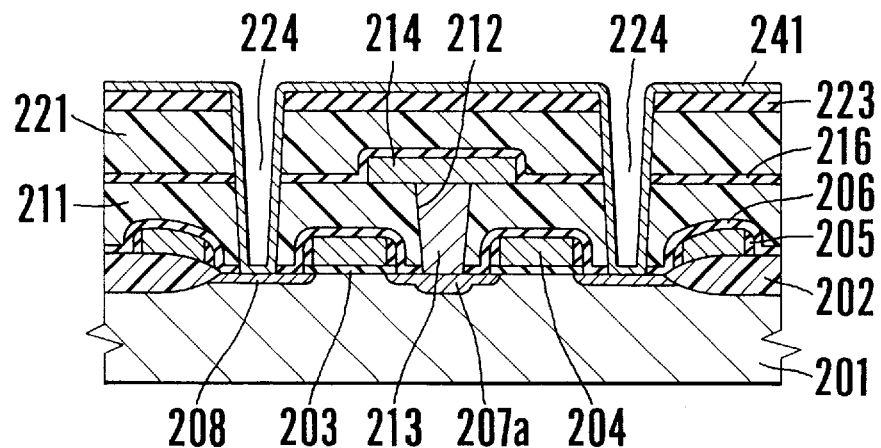
FIGS. 5A to 5E are schematic sectional views showing steps in manufacturing a semiconductor memory device according to the second embodiment of the present invention.
Figure 5B:
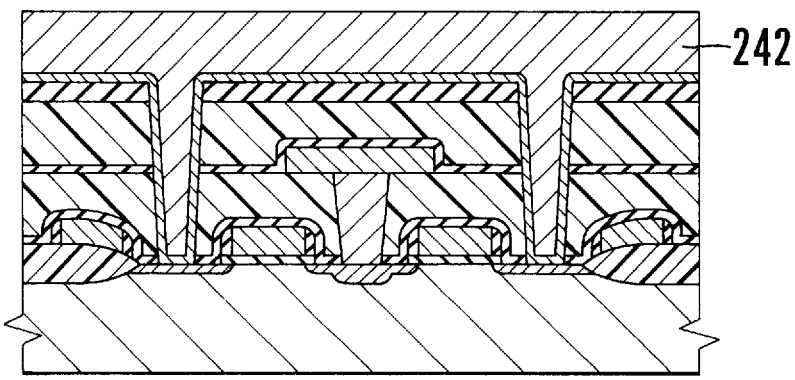
Figure 5C:
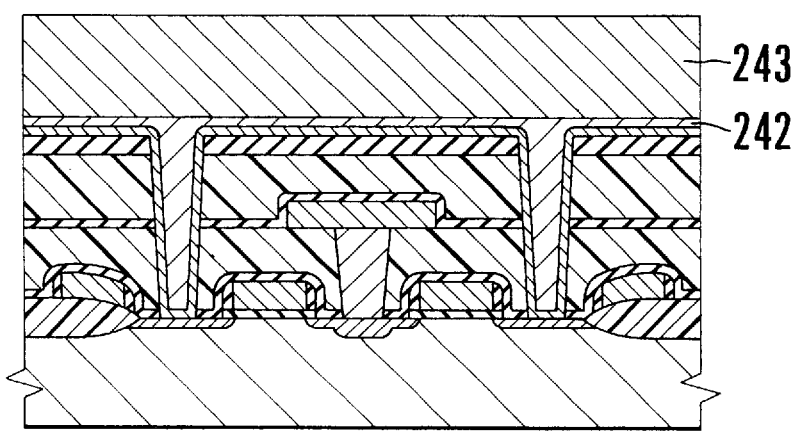
Figure 5D:
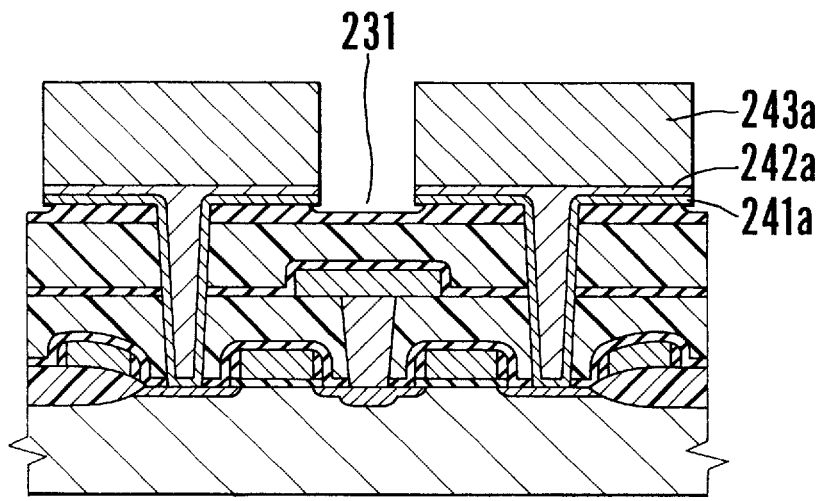
Figure 5E:
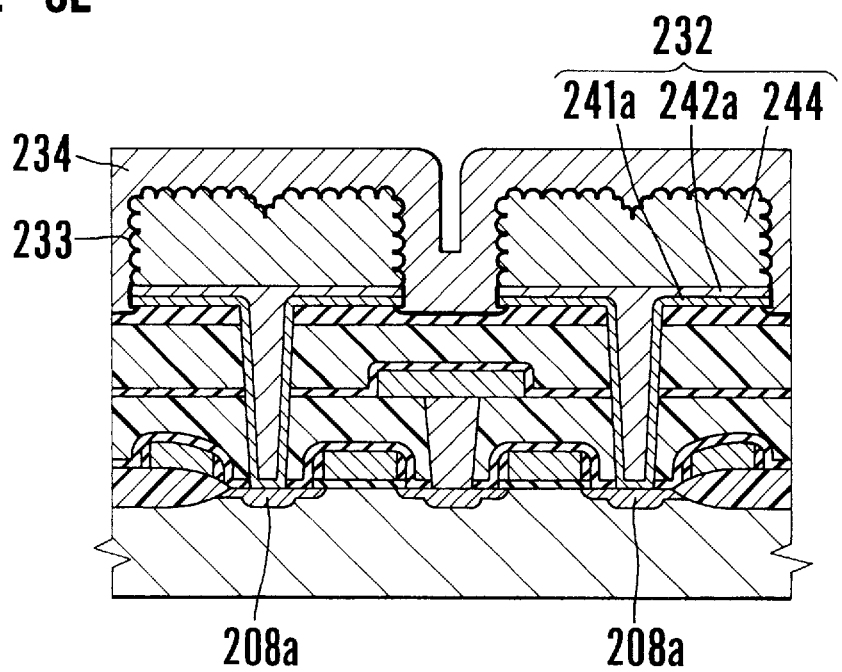
Figure 6A:
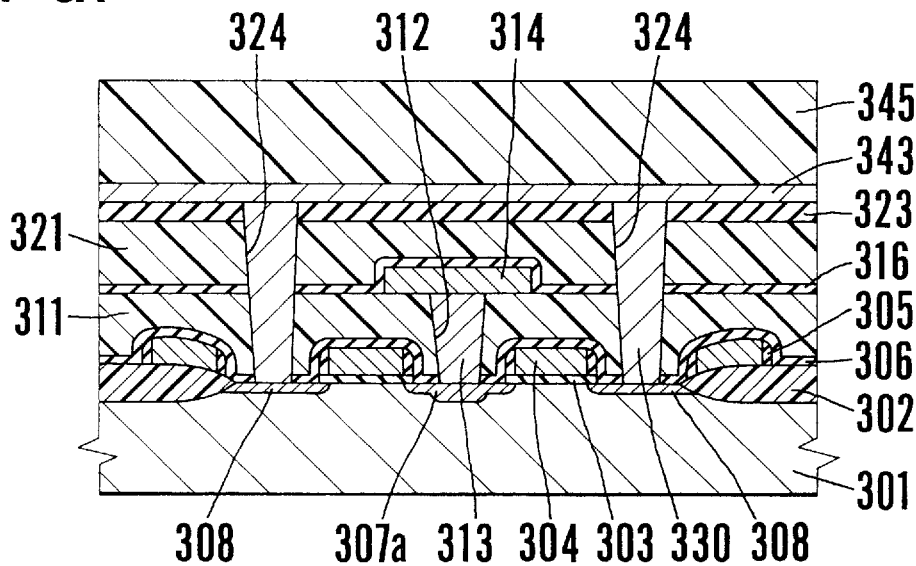
FIGS. 6A to 6D are schematic sectional views showing steps in manufacturing a semiconductor memory device according to the third embodiment of the present invention.
Figure 6B:
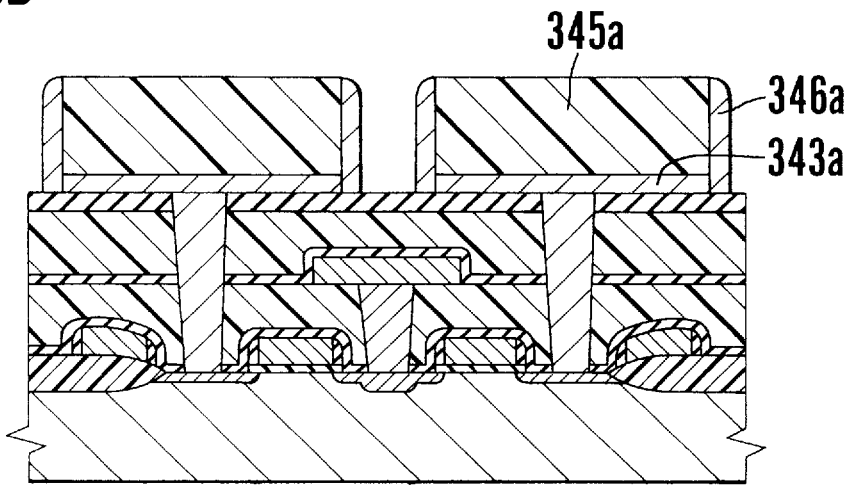
Figure 6C:
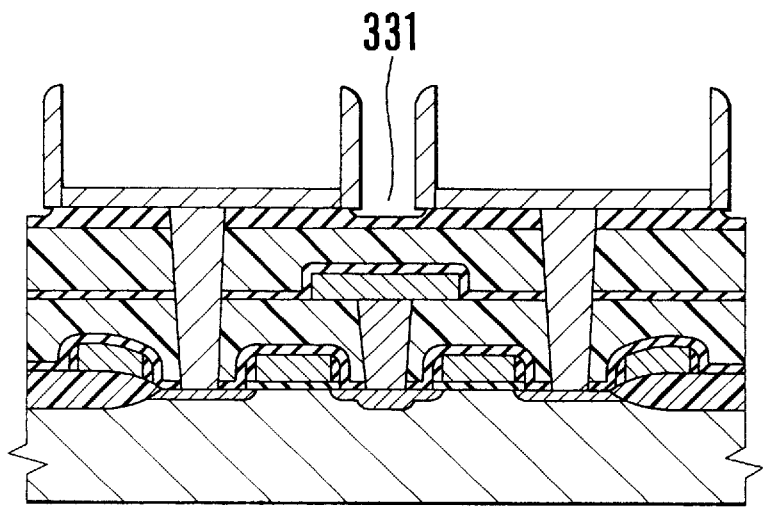
Figure 6D:
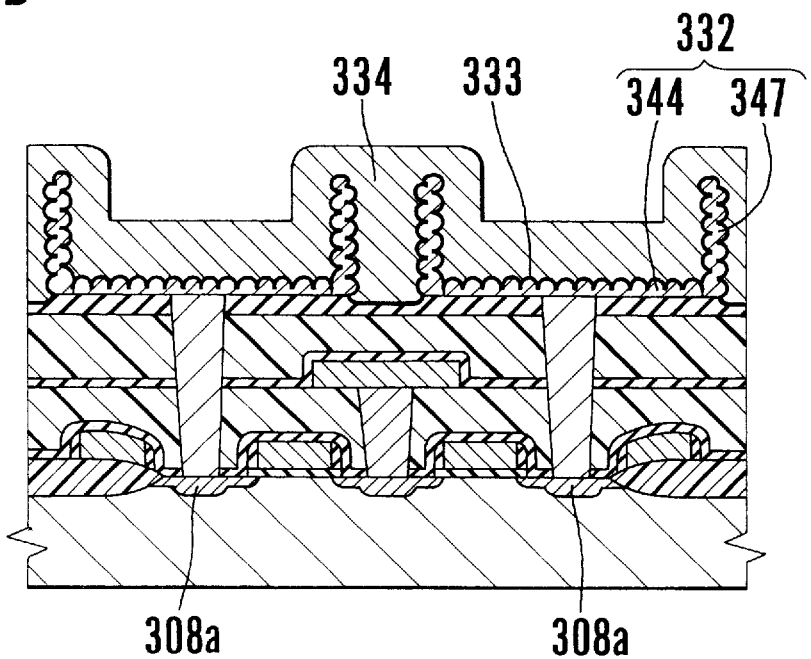

Appropriate conditions for the second annealing will be described with reference to FIGS. 3A to 3C which are graphs showing the dependency of the threshold value ($V_{TH}$) on the gate length L (designed value). The threshold value $V_{TH}$ is measured on the basis of a substrate back bias voltage $V_{SUB}$ of −1 V and a power supply voltage $V_{CC}$ of 2.5 V. In this case, the second silicon oxide film (LTO film) is formed by APCVD. However, almost the same measurement result as shown in FIGS. 3A to 3C can be obtained for an LTO film formed by PECVD. The $V_{TH}$ characteristic of a memory cell whose second silicon oxide film is formed from an HTO film having a thickness of about 100 nm is shown as a control. Since the growth rate of the HTO film at 800° C. is up to 2 nm/min, the time required only for formation of the HTO film having this thickness is approximately 50 minutes. However, as described above, the structure is held at 800° C. for a total of about three hours including the time for inserting/extracting the structure into/from the film forming apparatus.

When the designed gate length L is 0.25 μm, the threshold value $V_{TH}$ must be 0.9+0.1 V. For this reason, the second annealing at 800° C. is preferably performed for about 30 minutes, and the limit is about one hour (although not illustrated) [FIG. 3A]. The second annealing at 850° C. is preferably performed about five minutes [FIG. 3B]. The limit of the time of the second annealing at 900° C. is about one minute [FIG. 3C]. The second annealing at 750° C. to 800° C. can be performed as furnace annealing or RTA while the second annealing at 850° C. or 900° C. is limited to RTA.

Preferred embodiments of the present invention will be described next with reference to the accompanying drawings.

Formation of a DRAM memory cell according to the first embodiment of the present invention will be described below with reference to FIGS. 4A to 4E which are schematic sectional views showing steps in manufacturing the semiconductor memory device. For the illustrative convenience, only an amorphous silicon film and an insulating film are hatched in FIGS. 4A to 4E.

A LOCOS field oxide film 102 having a thickness of about 300 nm is formed in an element isolation region on the surface of a p-type silicon substrate 101. A gate oxide film 103 having a thickness of about 8 nm is formed in the element formation region by thermal oxidation. The surface impurity concentration at the interface between the p-type silicon substrate 101 and the gate oxide film 103 is about $5 \times 10^{17}$ cm$^{-2}$. A heavily doped n-type polysilicon film having a thickness of about 100 nm and a tungsten silicide film having a thickness of about 100 nm are formed on the entire surface. These stacked conductive films are patterned by photolithography using anisotropic etching such as reactive ion etching (RIE) to form gate electrodes 104 consisting of a tungsten polycide film. The gate electrodes 104 have underlaying gate oxide films and also serve as word lines. The designed line width (gate length L) and interval of the gate electrodes 104 are 0.25 μm and 0.35 μm, respectively. The gate electrodes 104 are formed in one direction to be almost parallel to each other. An insulating film (consisting of a silicon oxide film or a silicon nitride film) having a thickness of about 100 nm is formed on the entire surface and etched back by anisotropic dry etching to form insulating film spacers 105 covering the side walls of the gate electrodes 104. At this time, the gate oxide film 103 is also removed at portions other than portions immediately under the gate electrodes 104 and the insulating film spacers 105. After an HTO film 106 having a thickness of about 20 nm is formed on the entire surface, phosphorus is ion-implanted at $2 \times 10^{13}$ cm$^{-2}$ and 50 keV to form lightly doped n-type source/drain regions 107 and 108. The junction depth of the n-type source/drain regions 107 and 108 is roughly 0.1 μm. The transfer transistor is covered with the HTO film 106 to protect the transfer transistor from the first insulating interlayer to be formed later. The HTO film 106 is used because of its excellent step coverage. The HTO film 106 is formed before formation of the n-type source/drain regions 107 and 108 and therefore does not cause an increase in junction depth of the n-type source/drain regions 107 and 108.

Next, a first insulating interlayer consisting of a first BPSG film 111 having a thickness of about 800 nm is formed. This first BPSG film 111 is formed by APCVD using TEOS, TMP, TMB, and ozone as source gases and annealed at 700° C. for about 20 minutes (and also subjected to, e.g., chemical mechanical polishing (CMP)). This annealing is performed in consideration of the next etching process for forming a contact hole. With this annealing, the impurity in the n-type source/drain regions 107 and 108 is activated. A bit contact hole 112 reaching the n-type source/drain region 107 through the first BPSG film 111 and the HTO film 106 is formed by photolithography using anisotropic dry etching such as RIE. The designed size of the bit contact hole 112 is 0.25 μm. In fact, the bit contact hole 112 has a size of about 0.2 μm (at the upper end portion). The bit contact hole 112 is filled with a contact plug 113 consisting of an n-type polysilicon film containing phosphorus at a high concentration. This n-type polysilicon film is preferably of n type at the time of film formation. A heavily doped n-type polysilicon film having a thickness of about 100 nm and a tungsten silicide film having a thickness of about 100 nm are formed on the entire surface. These stacked conductive films are patterned by photolithography using, e.g., RIE to form a bit line 114 consisting of a tungsten polycide film. The bit line 114 is formed along a direction almost perpendicular to the gate electrodes 104 [FIG. 4A].

A first LTO film (not shown) having a thickness of about 100 nm is formed on the entire surface, and a second BPSG film 121 is formed by APCVD. The n-type source and drain regions have already been formed before formation of the first LTO film, so it is not preferable to form an HTO film in place of the LTO film (as described above). The first annealing is performed at 800° C. for 30 minutes to anneal the first LTO film and the second BPSG film 121 into an annealed silicon oxide film 116 and an annealed second BPSG film 121, respectively, thereby forming a second insulating interlayer from these stacked insulating films. With the first annealing, phosphorus is thermally diffused from the contact plug 113 so that the n-type source/drain region 107 becomes an n-type source/drain region 107a including a lightly doped region and a heavily doped region. The first LTO film is formed underneath the second BPSG film to prevent boron from diffusing from the second BPSG film into the tungsten silicide film constituting the bit line 114. When boron diffuses into the tungsten silicide film, the electric characteristics are degraded. Since the BPSG film 111 has already been annealed before the first annealing, diffusion of boron from the BPSG film 111 into the bit line 114 is almost negligible. A second LTO film 122 having a thickness of about 100 nm is formed on the entire surface by APCVD or PECVD [FIG. 4B].

The second annealing is performed under the annealing time condition described above with reference to FIGS. 3A to 3C, e.g., furnace annealing is performed at 800° C. for 30 minutes (furnace annealing at 750° C. to 800° C. or RTA at 750° C. to 900° C.) to anneal the second LTO film 122 into a silicon oxide film 123. Node contact holes 124 reaching the n-type source/drain regions 108 through the silicon oxide film 123, the second BPSG film 121, the silicon oxide film 116, the first BPSG film 111, and the HTO film 106 are formed by photolithography using anisotropic dry etching such as RIE [FIG. 4C].

An n-type amorphous silicon film (not shown) having a thickness of about 600 nm and heavily doped at the time of film formation is formed on the entire surface by LPCVD at 500° C. to 550° C. using disilane and phosphine (PH$_3$) as source gases. This amorphous silicon film is patterned by photolithography using anisotropic dry etching such as RIE to form amorphous silicon film patterns 143a. The short side of the upper surface of each amorphous silicon film pattern 143a is at least 0.3 μm. Etching is performed for about four minutes using dilute hydrofluoric acid at the above composition to remove native oxide films on the surfaces of the amorphous silicon film patterns 143a. A recessed portion 131 as deep as about 60 nm is formed on the surface of the silicon oxide film 123 exposed between the two adjacent amorphous silicon film patterns 143a [FIG. 4D].

In the first embodiment, contact plugs filling the node contact holes 124 may be formed before formation of the amorphous silicon film. When contact ion implantation is performed midway in the photolithography process of forming the node contact holes 124, the contact plugs can be formed from a nonsilicon-based conductive film. When the contact plugs are to be formed after the photolithography process of forming the node contact holes 124, the contact plugs are preferably formed from a heavily doped n-type polysilicon film. Since each node contact hole 124 has a high aspect ratio and a large depth, the contact plugs are formed in the following manner. An undoped polysilicon film having a thickness (e.g., 50 nm) smaller than ½ of the size (about 0.2 μm) of the node contact hole 124 is formed on the entire surface. Phosphorus is ion-implanted at $1\times10^{15}$ cm$^{-2}$ and 20 to 30 keV to convert the polysilicon film into a first n-type polysilicon film. A second n-type polysilicon film which is heavily doped at the time of film formation is formed on the entire surface. The second and first n-type polysilicon films are etched back. For ion implantation of phosphorus, the conditions must be set such that phosphorus is ion-implanted into the silicon oxide film 123.

The third annealing is performed to form storage mode electrodes 132 made of n-type polysilicon film patterns converted from the amorphous silicon film patterns 143a. This annealing comprises two-step annealing at a temperature of, e.g., about 590° C. slightly higher than the phase transition temperature from amorphous silicon to polysilicon. First, the structure is exposed to a disilane atmosphere at this temperature and a pressure of 133 Pa for about two minutes to convert the surface into a HSG surface. The resultant structure is continuously held in a non-oxidation atmosphere at 590° C. for around 10 minutes to convert the amorphous silicon film patterns into n-type polysilicon film patterns. Subsequently, a silicon nitride film (not shown) is formed on the entire surface by LPCVD at 650° C. using monosilane and ammonia (NH$_3$) as source gases. The surface of the silicon nitride film is oxidized for 30 minutes in a burning atmosphere in which oxygen and hydrogen (H$_2$) are combusted at 800° C., thereby forming a capacitive dielectric film 133 having a thickness of roughly 5 nm as a silicon oxide film thickness. Phosphorus diffuses from the storage mode electrodes 132 during oxidation of the silicon nitride film, so that the n-type source/drain regions 108 become n-type source/drain regions 108a including a lightly doped region and a heavily doped region. An n-type polysilicon film having a thickness of about 100 nm is formed on the entire surface by LPCVD using disilane and phosphine as source gases. RTA is performed at 800° C. for about 10 seconds to form a cell plate electrode 134 [FIG. 4E]. Thereafter, a third BPSG film is formed and annealed at 700° C. for approximately 20 minutes to form a third insulating interlayer including the third BPSG film on the entire surface.

The first embodiment satisfies appropriate conditions based on the examination result shown in FIGS. 1, 2, and 3A to 3C. In formation of a DRAM having an HSG stacked capacitor with a COB structure, the workability can be prevented from being degraded while maintaining a desired mechanical strength of the storage node electrode. Therefore, hold failures can be easily decreased (while preventing the threshold value V$_{TH}$ of the transfer transistor from varying to a small value).

Formation of a DRAM memory cell according to the second embodiment of the present invention will be described below with reference to FIGS. 5A to 5E which are schematic sectional views showing steps in manufacturing the semiconductor memory device.

As in the first embodiment, a LOCOS field oxide film 202 having a thickness of about 300 nm is formed in an element isolation region on the surface of a p-type silicon substrate 201. A gate oxide film 203 having a thickness of about 8 nm is formed in the element formation region. A heavily doped n-type polysilicon film having a thickness of about 100 nm and a tungsten silicide film having a thickness of about 100 nm are formed on the entire surface. These stacked conductive films are patterned to form gate electrodes 204 with underlaying gate oxide films. An insulating film having a thickness of about 100 nm is formed on the entire surface and etched back to form insulating film spacers 205 covering the side walls of the gate electrodes 204. After an HTO film 206 having a thickness of about 20 nm is formed on the entire surface, phosphorus is ionimplanted to form one (not shown) of lightly doped n-type source/drain regions and lightly doped n-type source/drain regions 208. A first insulating interlayer consisting of a first BPSG film 211 having a thickness of about 800 nm is formed. A bit contact hole 212 reaching one of the n-type source/drain regions through the first BPSG film 211 and the HTO film 206 is formed. The bit contact hole 212 is filled with a contact plug 213 consisting of an n-type polysilicon film containing phosphorus at a high concentration. A heavily doped n-type polysilicon film having a thickness of about 100 nm and a tungsten silicide film having a thickness of about 100 nm are formed on the entire surface. These stacked conductive films are patterned to form a bit line 214.

A first LTO film (not shown) having a thickness of approximately 100 nm is formed on the entire surface, and a second BPSG film 221 is formed by APCVD. The first annealing is performed at 800° C. for 30 minutes to anneal the first LTO film and the second BPSG film 221 into an annealed silicon oxide film 216 and an annealed second BPSG film 221, respectively, thereby forming a second insulating interlayer from these stacked insulating films. With the first annealing, the one of n-type source/drain regions becomes an n-type source/drain region 207a including a lightly doped region and a heavily doped region. A second LTO film (not shown) having a thickness of about 100 nm is formed on the entire surface by APCVD or PECVD. The second annealing is performed under the same conditions as in the first embodiment to anneal the second LTO film into a silicon oxide film 223. Node contact holes 224 (having a size of about 0.2 μm) reaching the n-type source/drain regions 208 through the silicon oxide film 223, the second BPSG film 221, the silicon oxide film 216, and the first BPSG film 211, and the HTO film 206 are formed.

An undoped polysilicon film (not shown) having a thickness of about 50 nm is formed on the entire surface. Phosphorus is ion-implanted at $1\times10^{15}$ cm$^{-2}$ and 20 to 30 keV to convert the polysilicon film into a first n-type polysilicon film 241. The ion implantation energy is set not to ion-implant phosphorus into the silicon oxide film 223 [FIG. 5A]. Next, a second n-type polysilicon film 242 having a thickness of about 20 nm and heavily doped at the time of film formation is formed on the entire surface by LPCVD using disilane and phosphine as source gases [FIG. 5B]. The n-type polysilicon film 242 is etched back to leave an n-type polysilicon film 242a having a thickness of about 50 nm. An n-type amorphous silicon film 243 having a thickness of about 600 nm and heavily doped at the time of film formation is formed on the entire surface by LPCVD at 500° C. to 550° C. using disilane and phosphine as source gases [FIG. 5C].

The amorphous silicon film 243, the n-type polysilicon film 242a, and the n-type polysilicon film 241 are sequentially patterned by photolithography using anisotropic dry etching such as RIE to leave amorphous silicon film patterns 243a, n-type polysilicon film patterns 242aa, and n-type polysilicon film patterns 241a. The short side of the upper surface of each amorphous silicon film pattern 243a is at least 0.3 µm. Etching is performed for around four minutes using dilute hydrofluoric acid having a composition of HF:H$_2$O=1:100 to remove the native oxide films on the exposed surfaces of the amorphous silicon film patterns 243a, the n-type polysilicon film patterns 242aa, and the n-type polysilicon film patterns 241a. A recessed portion 231 as deep as about 60 nm is formed on the surface of the silicon oxide film 223 exposed between the two adjacent amorphous silicon film patterns 243a [FIG. 5D].

The third annealing is performed, as in the first embodiment, to convert the amorphous silicon film patterns 243a into n-type polysilicon film patterns 244 having HSG-converted surfaces. With this process, storage node electrodes 232 each constituted by the n-type polysilicon film pattern 244, the n-type polysilicon film pattern 242aa, and the n-type polysilicon film pattern 241a are formed. A silicon nitride film (not shown) is formed on the entire surface by LPCVD at 650° C. using monosilane and ammonia as source gases. The surface of the silicon nitride film is oxidized by burning at 800° C. for 30 minutes to form a capacitive dielectric film 233 having a thickness of about 5 nm as a silicon oxide film thickness. Phosphorus diffuses from the storage node electrodes 232 during oxidation of the silicon nitride film, so that the n-type source/drain regions 208 become n-type source/drain regions 208a including a lightly doped region and a heavily doped region. An n-type polysilicon film having a thickness of about 100 nm is formed on the entire surface by LPCVD using disilane and phosphine as source gases. RTA is performed at 800° C. for about 10 seconds to form a cell plate electrode 234 [FIG. 5E]. Thereafter, a third BPSG film is formed and annealed at 700° C. for about 20 minutes to form a third insulating interlayer including the third BPSG film on the entire surface.

The second embodiment has the effect of the first embodiment. In the second embodiment, as described in Japanese Patent Application No. 7-336803, the amorphous silicon film pattern 243a is formed on the n-type polysilicon film pattern 242aa. With this arrangement, diffusion of phosphorus due to HSG conversion of the amorphous silicon film pattern 243a and formation of the capacitive dielectric film 233 is suppressed by the n-type polysilicon film pattern 242aa. The junction leakage in the n-type diffusion layer 208a becomes smaller than that in the first embodiment. Therefore, a memory cell having more excellent hold characteristics than the first embodiment can be obtained.

Formation of a DRAM memory cell according to the third embodiment of the present invention will be described below with reference to FIGS. 6A to 6D which are schematic sectional views showing steps in manufacturing the semiconductor memory device.

As in the first and second embodiments, a LOCOS field oxide film 302 having a thickness of about 300 nm is formed in an element isolation region on the surface of a p-type silicon substrate 301. A gate oxide film 303 having a thickness of about 8 nm is formed in the element formation region. Gate electrodes 304 consisting of a tungsten polycide film are formed. Insulating film spacers 305 covering the side walls of the gate electrodes 304 are formed. After an HTO film 306 having a thickness of about 20 nm is formed on the entire surface, phosphorus is ion-implanted to form one (not shown) of lightly doped n-type source/drain regions and lightly doped n-type source/drain regions 308. A first insulating interlayer consisting of a first BPSG film 311 having a thickness of about 800 nm is formed. A bit contact hole 312 reaching one of the n-type source/drain regions through the first BPSG film 311 and the HTO film 306 is formed. The bit contact hole 312 is filled with a contact plug 313 consisting of an n-type polysilicon film containing phosphorus at a high concentration. A bit line 314 consisting of a tungsten polycide film is formed.

A first LTO film (not shown) having a thickness of about 100 nm is formed on the entire surface, and a second BPSG film 321 is formed by APCVD. The first annealing is performed at 800° C. for 30 minutes to anneal the first LTO film and the second BPSG film into an annealed silicon oxide film 316 and an annealed second BPSG film 321, respectively, thereby forming a second insulating interlayer from these stacked insulating films. With the first annealing, the one of n-type source/drain regions becomes an n-type source/drain region 307a including a lightly doped region and a heavily doped region. A second LTO film (not shown) having a thickness of about 100 nm is formed on the entire surface by APCVD or PECVD. The second annealing is performed under the same conditions as in the first and second embodiments to anneal the second LTO film into a silicon oxide film 323. Node contact holes 324 reaching the n-type source/drain regions 308 through the silicon oxide film 323, the second BPSG film 321, the silicon oxide film 316, the first BPSG film 311, and the HTO film 306 are formed. The node contact holes 324 are filled with contact plugs 330 consisting of a heavily doped n-type polysilicon film. A first n-type amorphous silicon film 343 having a thickness of about 100 nm and heavily doped at the time of film formation is formed on the entire surface by LPCVD at 500° C. to 550° C. using disilane and phosphine as source gases. A PSG film 345 having a thickness of about 400 nm is formed on the entire surface by APCVD [FIG. 6A].

The PSG film 345 and the amorphous silicon film 343 are sequentially patterned by photolithography such as RIE to leave PSG film patterns 345a and amorphous silicon film patterns 343a. The interval between the two adjacent PSG film patterns 345a is about 0.25 µm. A second n-type amorphous silicon film (not shown) having a thickness of about 100 nm and heavily doped at the time of film formation is formed on the entire surface by LPCVD at 500° C. to 550° C. using disilane and phosphine as source gases. The second amorphous silicon film is selectively etched back by RIE to leave amorphous silicon film patterns 346a covering the side surfaces of the PSG film patterns 345a and the amorphous silicon film patterns 343a [FIG. 6B].

Etching is performed for about four minutes using dilute hydrofluoric acid having a composition of HF: H$_2$=1:100. Since the etch rate of etching using dilute hydrofluoric acid for the PSG film which has not been annealed is 140 to 190 nm/min, the PSG film patterns 345a are removed by this etching for four minutes. In addition, the native oxide films on the exposed surfaces of the amorphous silicon film patterns 346a and the amorphous silicon film patterns 343a are removed. Furthermore, a recessed portion 331 as deep as 60 nm is formed on the surface of the silicon oxide film 323 exposed between the two adjacent amorphous silicon film patterns 346a [FIG. 6C].

The third annealing is performed, as in the first and second embodiments, to convert the amorphous silicon film patterns 346a and 343a into n-type polysilicon film patterns 347 and 344 having HSG-converted surfaces, respectively. With this process, storage node electrodes 332 each constituted by the n-type polysilicon film patterns 347 and 344 are formed. A silicon nitride film (not shown) is formed on the entire surface by LPCVD at 650° C. using monosilane and ammonia as source gases. The surface of the silicon nitride film is oxidized by burning at 800° C. for 30 minutes to form a capacitive dielectric film 333 having a thickness of about 5 nm as a silicon oxide film thickness. Phosphorus diffuses from the contact plugs 330 during oxidation of the silicon nitride film, so that the n-type source/drain regions 308 become n-type source/drain regions 308s including a lightly doped region and a heavily doped region. An n-type polysilicon film having a thickness of about 100 nm is formed on the entire surface by LPCVD using disilane and phosphine as source gases. RTA is performed at 800° C. for about 10 seconds to form a cell plate electrode 334 [FIG. 6D]. Thereafter, a third BPSG film is formed and annealed at 700° C. for about 20 minutes to form a third insulating interlayer including the third BPSG film on the entire surface.

The third embodiment has the effect of the first embodiment.

What is claimed is:

1. A method of manufacturing a semiconductor memory device, comprising the steps of:

forming a gate electrode with underlaying gate oxide film on a surface of a p-type silicon substrate, forming an insulating film spacer covering a side wall of said gate electrode, forming a first silicon oxide film on an entire surface by high-temperature chemical vapor deposition, ion-implanting an n-type impurity into said surface of said p-type silicon substrate to form n-type source/drain regions, forming a first insulating interlayer on the entire surface, forming a bit contact hole reaching one of said n-type source/drain regions through said first insulating interlayer and said first silicon oxide film, and forming a bit line;

forming a second silicon oxide film on the entire surface by low-temperature chemical vapor deposition, forming a BPSG film on the entire surface, and annealing said second silicon oxide film and said BPSG film by first annealing to form a second insulating interlayer constituted by the stacked films;

forming a third silicon oxide film on the entire surface by low-temperature chemical vapor deposition, and annealing said third silicon oxide film by second annealing;

forming a node contact hole reaching the other of said n-type source/drain regions through the annealed third silicon oxide film, said second insulating interlayer, said first insulating interlayer, and said first silicon oxide film;

forming an amorphous silicon film doped n-type at the time of film formation on the entire surface, patterning said amorphous silicon film to form an amorphous silicon film pattern, and removing a native oxide film on a surface of said amorphous silicon film pattern using dilute hydrofluoric acid; and converting said amorphous silicon film pattern into an n-type hemispherical grained (HSG) polysilicon film pattern by third annealing to form a storage node electrode, forming a capacitive dielectric film, and forming a cell plate electrode.

2. A method according to claim 1, wherein the low-temperature chemical vapor deposition is atmospheric pressure chemical vapor deposition (APCVD) or plasma enhanced chemical vapor deposition (PECVD).

3. A method according to claim 1, wherein the second annealing is rapid thermal annealing (RTA) at 750° C. to 950° C. or furnace annealing at 750° C. to 800° C.

4. A method according to claim 1, further comprising, after the step of forming the node contact hole, forming a contact plug filling the node contact hole.

5. A method according to claim 4, further comprising, after the step of forming the node contact hole, forming an undoped polysilicon film having a thickness smaller than ½ of a size of the node contact hole on the entire surface, ion-implanting an n-type impurity to convert said polysilicon film into a first n-type polysilicon film, forming a second n-type polysilicon film on the entire surface, and etching back said second and first n-type polysilicon films.

6. A method of manufacturing a semiconductor memory device, comprising the steps of:

forming a gate electrode with underlying gate oxide film on a surface of a p-type silicon substrate, forming an insulating film spacer covering a side wall of said gate electrode, forming a first silicon oxide film on an entire surface by high-temperature chemical vapor deposition, ion-implanting an n-type impurity into said surface of said p-type silicon substrate to form n-type source/drain regions, forming a first insulating interlayer on the entire surface, forming a bit contact hole reaching one of said n-type source/drain regions through said first insulating interlayer and said first silicon oxide film, and forming a bit line;

forming a second silicon oxide film on the entire surface by low-temperature chemical vapor deposition, forming a BPSG film on the entire surface, and annealing said second silicon oxide film and said BPSG film by first annealing to form a second insulating interlayer constituted by the stacked films;

forming a third silicon oxide film on the entire surface by low-temperature chemical vapor deposition, and annealing said third silicon oxide film by second annealing;

forming a node contact hole reaching the other of said n-type source/drain regions through the annealed third silicon oxide film, said second insulating interlayer, said first insulating interlayer, and said first silicon oxide film;

forming an undoped polysilicon film having a thickness smaller than ½ of a size of the node contact hole on the entire surface, ion-implanting an n-type impurity to convert said polysilicon film into a first n-type polysilicon film, forming a second n-type polysilicon film on the entire surface, forming an amorphous silicon film doped n-type at the time of film formation on the entire surface, patterning said amorphous silicon film and said second and first n-type polysilicon films to form an amorphous silicon film pattern and second and first n-type polysilicon film patterns, and removing native oxide films on surfaces of said second and first n-type polysilicon film patterns and a surface of said amorphous silicon film pattern using dilute hydrofluoric acid; and converting said amorphous silicon film pattern into a third n-type HSG polysilicon film pattern by third annealing to form a storage node electrode constituted by said first, second, and third n-type polysilicon film patterns, forming a capacitive dielectric film, and forming a cell plate electrode.

7. A method according to claim 6, wherein the low-temperature chemical vapor deposition is APCVD or PECVD.

8. A method according to claim 6, wherein the second annealing is RTA at 750° C. to 950° C. or furnace annealing at 750° C. to 800° C.

9. A method of manufacturing a semiconductor memory device, comprising the steps of:

forming a gate electrode with underlying gate oxide film on a surface of a p-type silicon substrate, forming an insulating film spacer covering a side wall of said gate electrode, forming a first silicon oxide film on an entire surface by high-temperature chemical vapor deposition, ion-implanting an n-type impurity into said surface of said p-type silicon substrate to form n-type source/drain regions, forming a first insulating interlayer on the entire surface, forming a bit contact hole reaching one of said n-type source/drain regions through said first insulating interlayer and said first silicon oxide film, and forming a bit line;

forming a second silicon oxide film on the entire surface by low-temperature chemical vapor deposition, forming a BPSG film on the entire surface, and annealing said first silicon oxide film and said BPSG film by first annealing to form a second insulating interlayer constituted by the stacked films;

forming a third silicon oxide film on the entire surface by low-temperature chemical vapor deposition, and annealing said third silicon oxide film by second annealing;

forming a node contact hole reaching the other of said n-type source/drain regions through the annealed third silicon oxide film, said second insulating interlayer, said first insulating interlayer, and said first silicon oxide film;

sequentially forming a first amorphous silicon film doped n-type at the time of film formation and a PSG film on the entire surface, sequentially patterning said PSG film and said first amorphous silicon film to form a PSG film pattern and a first amorphous silicon film pattern, forming a second amorphous silicon film doped n-type at the time of film formation on the entire surface, and etching back said second amorphous silicon film to form a second amorphous silicon film pattern covering side surfaces of said PSG film pattern and said first amorphous silicon film pattern;

removing said PSG film pattern and native oxide films on surfaces of said first and second amorphous silicon film patterns using dilute hydrofluoric acid; and converting said first and second amorphous silicon film patterns into a first and second n-type HSG polysilicon film patterns by third annealing, respectively, to form a storage node electrode, forming a capacitive dielectric film, and forming a cell plate electrode.

10. A method according to claim 9, wherein the low-temperature chemical vapor deposition is APCVD or PECVD.

11. A method according to claim 9, wherein the second annealing is RTA at 750° C. to 950° C. or furnace annealing at 750° C. to 800° C.

12. A method according to claim 9, further comprising, after the step of forming the node contact hole, forming a contact plug filling the node contact hole.

* * * * *

UNITED STATES PATENT AND TRADEMARK OFFICE
CERTIFICATE OF CORRECTION

PATENT NO. : 5,858,837
DATED : January 12, 1999
INVENTOR(S) : Takashi SAKOH, Ichiro HONMA It is certified that error appears in the above-identified patent and that said Letters Patent is hereby corrected as shown below:

Column 3, Line 30, delete "D"

Column 9, Line 11, delete "0.9 +0.1 V" and insert --0.9 ± 0.1 V--

Signed and Sealed this

Sixth Day of July, 1999

Q. TODD DICKINSON

Attest:

Attesting Officer

Acting Commissioner of Patents and Trademarks